United States Patent [19]

Murata

[11] Patent Number: 4,739,226

[45] Date of Patent: Apr. 19, 1988

[54] DIMMING CIRCUIT HAVING SWITCHING TRANSISTOR PROTECTION MEANS

[75] Inventor: Hajime Murata, Shimada, Japan

[73] Assignee: Yazaki Corporation, Japan

[21] Appl. No.: 853,179

[22] Filed: Apr. 17, 1986

[30] Foreign Application Priority Data

Apr. 18, 1985 [JP] Japan ............................ 60-56823[U]

[51] Int. Cl.[4] ........................ H05B 39/04; H02H 3/20; H02H 3/26

[52] U.S. Cl. ................................ 315/224; 315/209 R; 315/246; 315/307; 315/287; 315/225; 315/127; 315/82; 361/111; 361/98; 361/101; 361/71; 361/79; 307/10 LS

[58] Field of Search ................. 315/246, 225, 224, 76, 315/82, 119, 127, 287; 361/52, 56, 88, 90, 98, 101, 111; 307/10 LS

[56] References Cited

U.S. PATENT DOCUMENTS 3,263,119 7/1966 Scholl ................................. 315/127
3,578,983 5/1971 Kondo ............................. 361/88 X
3,889,159 6/1975 Wessel .................................. 361/88
4,024,437 5/1977 Suzuki .............................. 361/88 X
4,158,866 6/1979 Baker ............................... 361/88 X
4,321,509 3/1982 Miyaji et al. .................... 315/127 X
4,430,684 2/1984 Lefèbvre et al. ................. 361/88 X
4,525,765 6/1985 Bradjer ................................ 361/88
4,593,233 6/1986 Taylor et al. ......................... 361/88

*Primary Examiner*—David K. Moore
*Assistant Examiner*—Mark R. Powell
*Attorney, Agent, or Firm*—Wigman & Cohen

[57] ABSTRACT

A dimming circuit adjusts the light output of a lamp by controlling the current flow in the lamp that is connected to a transistor, through turning on and off the transistor with a predetermined timing which is changed by the control signal from a control signal generating circuit. The dimming circuit has a protective circuit for applying an off-state command signal to switch the transistor to the off-state by detecting an excess current flowing in the transistor when an input signal is applied as a control signal for switching the transistor to the on-state.

3 Claims, 2 Drawing Sheets

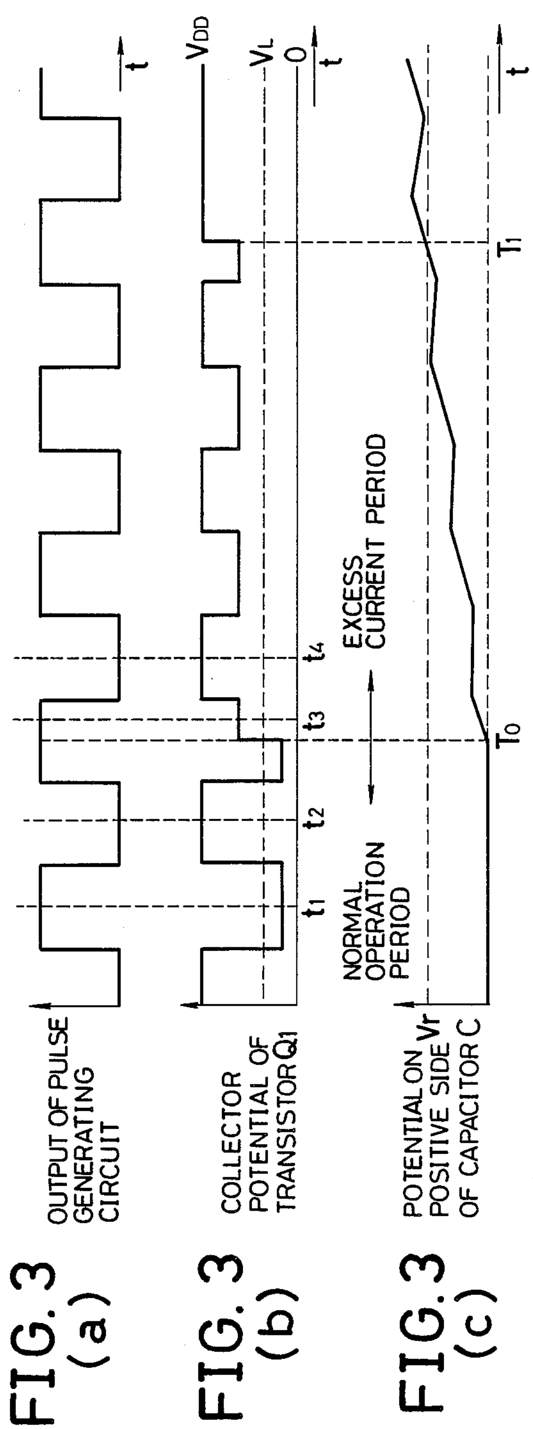
FIG. 3 (a)
FIG. 3 (b)
FIG. 3 (c)
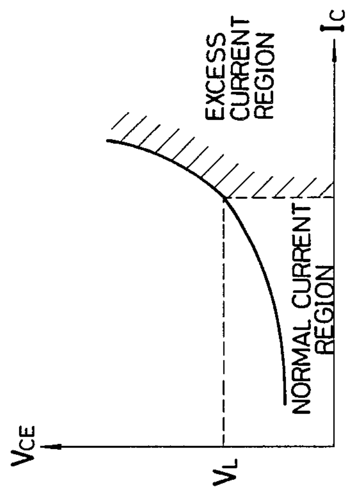
FIG. 4

DIMMING CIRCUIT HAVING SWITCHING TRANSISTOR PROTECTION MEANS

BACKGROUND OF THE INVENTION

1. Field of the Invention

The present invention relates to a dimming circuit for adjusting the light output of a lamp by controlling the current flow in the lamp through turning on and off of a switching means. More particularly, the present invention relates to a dimming circuit which puts the switching means to the off-state to protect the circuit, when there flows an excessive current in the switching means in its on-state.

2. Description of the Prior Art

A prior dimming circuit has generally a composition as shown in FIG. 1.

In the figure, a pulse generating circuit 4 outputs a pulse with variable duty ratio, which is applied to the base of a transistor $Q_1$ for driving the lamp. Further, between the emitter output of the transistor $Q_1$ and the power source +B, there is connected a lamp 3.

The transistor $Q_1$ is turned on and off by a pulse from the pulse generating circuit 4, and the lamp 3 radiates light accompanying this on and off operation. The quantity of light radiated by the lamp 3 is adjusted by controlling the current flow in the lamp 3 through variation of the pulse duty by means of a duty varying means that is provided in the pulse generating circuit 4.

In such a prior composition, when the lamp 3 is short-circuited for some reason, the transistor $Q_1$ undergoes intermittently a state of excessive load, which leads to a problem that the transistor $Q_1$ may sometimes be broken due to excessive current.

SUMMARY OF THE INVENTION

An object of the present invention is to provide, by solving the problems mentioned above, a dimming circuit which can avoid, when the lamp is short-circuited, the breakdown of the switching means that controls the light output of the lamp.

Another object of the present invention is to provide a dimming circuit which can break, when the lamp is short-circuited, the flow of an excessive current beyond a predetermined value in the switching means.

Another object of the present invention is to provide a dimming circuit which switches, when the lamp is short-circuited, the switching means to the off-state.

Another object of the present invention is to provide a dimming circuit, in the case where the switching means consists of a transistor, which can regulate, when the lamp is short-circuited, the flow of an excess current beyond a predetermined value without adversely affecting the light output of the lamp at normal operating conditions.

Another object of the present invention is to provide a dimming circuit which can preclude such malfunctions as the interruption of current flow to the lamp due to a rush current to the lamp or the like, in spite of the fact that the lamp is not short-circuited.

Another object of the present invention is to provide a dimming circuit which will not reinstate the switching means to the on-state after the lamp is short-circuited and the switching means is put to the off-state, unless the operator performs such operation as opening the power switch for the lamp.

In order to achieve the foregoing objects, in a dimming circuit that adjusts the radiating condition of a lamp by controlling the current flow in the lamp that is connected to a switching means, through change in the content of a control signal by means of turning on and off of the switching means with predetermined timing based on the control signal from a control signal generating circuit, the present invention includes a protective device that operates as follows. Namely, when a control signal for setting the switching means to the on-state is applied, if an excessive current flows in the switching means, the protective device applies, by detecting the excess current, and when the integrated value of the excess current reaches approximately a predetermined value, an off-state command signal for switching the switching means to off-state.

DESCRIPTION OF THE DRAWINGS

FIGS. 3*a* to 3*c* are diagrams showing the voltage waveforms at various points in the circuit shown in FIG. 2.

FIG. 4 is a diagram showing the characteristics of the collector current versus the voltage between the collector and emitter of the transistor driving the lamp in the circuit shown in FIG. 2.

DESCRIPTION OF THE PREFERRED EMBODIMENTS

Figure 1:
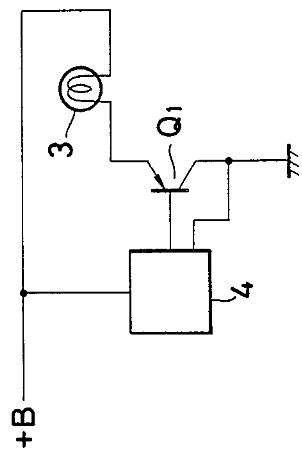
FIG. 1 is a circuit diagram showing a prior dimming circuit.
Figure 2:
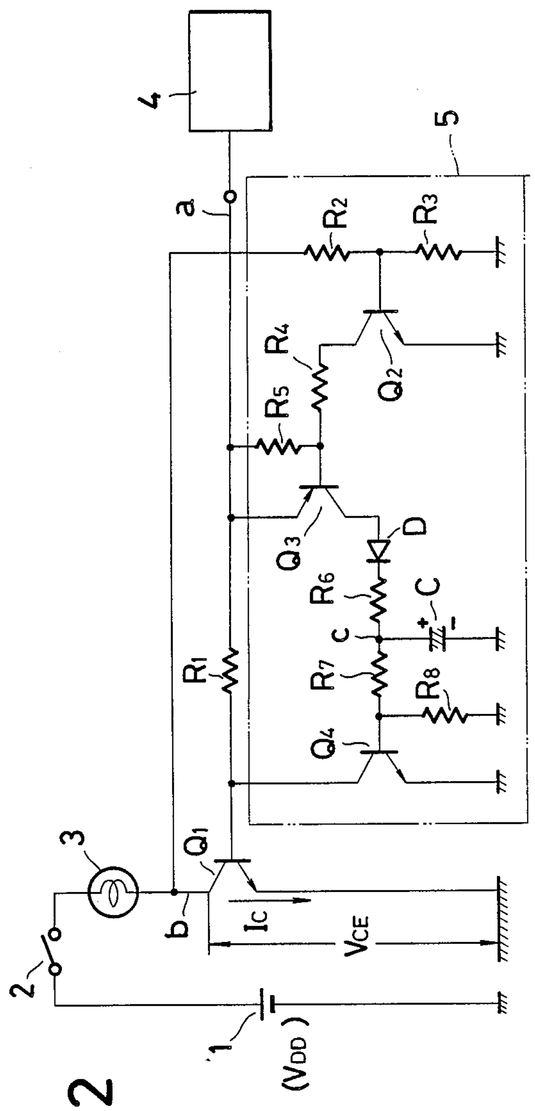
FIG. 2 is a circuit diagram that shows an embodiment of the dimming circuit in accordance with the present invention.

Referring to FIG. 2, the principal part of the dimming circuit connector in series a battery 1 to be put on a motor vehicle, an illumination switch 2, an illumination lamp 3, and a transistor $Q_1$ for driving the lamp 3.

The base of the driving transistor $Q_1$ is connected to a pulse generating circuit 4 via a resistor $R_1$ for limiting the base current.

Further, a protective circuit 5 protecting the transistor $Q_1$ is provided and connected to the collector and the base terminal of the driving transistor $Q_1$, and also to the output terminal of the pulse generating circuit 4. The protective circuit 5 is constructed as follows. Namely, resistors $R_2$ and $R_3$ are connected in series between the collector and the emitter (reference potential) of $Q_1$. The base of a transistor $Q_2$ is connected to the juncture of the two resistors $R_2$ and $R_3$, and the collector of the transistor $Q_2$ is connected via a resistor $R_4$ to the base of a transistor $Q_3$. Further, the emitter of the transistor $Q_3$ is connected to the output terminal of the pulse generating circuit 4, and the emitter and the base of the transistor $Q_3$ is bridged by a resistor $R_5$. Moreover, the collector of the transistor $Q_3$ is connected via a diode D and a resistor $R_6$, and through a capacitor C and resistors $R_7$ and $R_8$ that form a time constant circuit, to the base of a transistor $Q_4$. The collector and the emitter of the transistor $Q_4$ are connected to the base and emitter, respectively, of the transistor $Q_1$.

With such a construction, the operation of the circuit will now be described by referring to the time charts (a), (b), and (c) of FIG. 3. Here, (a), (b), and (c) of FIG. 3 show the waveforms of voltage at the points a, b, and c, respectively, in FIG. 2.

When the illumination switch 2 is closed, a positive voltage is applied to the lamp 3 by the battery 1 placed on the motor vehicle. Upon impression of a pulse input signal from the pulse generating circuit 4 on the base of transistor $Q_1$, the transistor $Q_1$ becomes on-state intermittently, with the lamp 3 lighted during on-state and turned off during off-state. Here, the frequency of the pulse generating circuit 4 is set to be more than several tens of Hz in order not to be bothered by turning on and off of the lamp 3.

With the normal connection of the lamp 3, when lighting pulses as shown by FIG. 3(*a*) are supplied to the base of the transistor $Q_1$ from the pulse generating circuit 4, the collector voltage of the transistor $Q_1$ shows the waveform for normal operation period in the voltage waveform shown in FIG. 3(*b*).

For instance, when the output terminal of the pulse generating circuit 4 and the base of the transistor $Q_1$ is at a high voltage, and the lamp 3 is in the lighting condition as shown for time $t=t_1$ in FIG. 3, the collector current of the transistor $Q_1$ is in the normal current region in the collector current Ic versus collector voltage $V_{CE}$ characteristics shown in FIG. 4, so that the collector voltage of the transistor $Q_1$ is below the limiting voltage $V_L$ as shown in FIG. 2(*b*). Hence, the base voltage of the transistor $Q_2$ is also below a predetermined voltage because of the voltage division due to the resistors $R_2$ and $R_3$. This puts the transistor $Q_2$ in an off-state. Consequently, the transistor $Q_3$ is in off-state also. Here, the limiting voltage is determined by the voltage division ratio of the resistors $R_2$ and $R_3$ and the on-state voltage that is applied to the base of the transistor $Q_2$, and is set to a suitable value in view of the $I_C-V_{CE}$ characteristics for the transistor $Q_1$ shown in FIG. 4.

Moreover, when, for example, the output terminal of the pulse generating circuit 4 is at a low voltage, as shown for time $t=t_2$ of FIG. 3, the transistor $Q_1$ is in off-state, the lamp 3 is turned and, the collector voltage of the transistor $Q_1$ is above the limiting voltage $V_L$ (that is, $V_{CE}\approx V_{DD}$) so that the transistor $Q_2$ is in an on-state. Since, however, the output terminal of the pulse generating circuit 4 is at a low voltage as mentioned above and a low voltage is applied to the emitter of the transistor $Q_3$, the transistor $Q_3$ is in off-state.

As in the above, when the lamp 3 is connected normally, the transistor $Q_3$ will remain in an off-state for both the on and off conditions of the lamp 3. Consequently, no current will be supplied through the diode D and the resistor $R_6$ to the capacitor C. Hence, the potential on the positive side of the capacitor C will not be increased and the transistor $Q_4$ will be maintained in an off-state.

Next, if the lamp 3 is short-circuited at $t=T_0$ of FIG. 3 due to a failure, the collector voltage of the transistor $Q_1$ will show a waveform for excess current period in the voltage waveform of FIG. 3(*b*).

For example, when the output terminal of the pulse generating circuit 4 is on a high voltage, the transistor $Q_1$ is turned on by the lighting pulse, and the lamp 3 is in the lighting condition, as at the time $t=t_3$ shown in FIG. 3, the collector current of the transistor $Q_1$ is in the excess current region of FIG. 4 and the collector voltage of the transistor $Q_1$ will become more than the limiting voltage $V_L$ as shown in FIG. 3(*b*). Then, due to the voltage division by the resistors $R_2$ and $R_3$, the base voltage of the transistor $Q_2$ will also become more than the limiting voltage, and the transistor $Q_2$ will be switched to the on-state. Since the voltage at the output terminal of the pulse generating circuit 4 is a high voltage, a high voltage is applied to the emitter of the transistor $Q_3$. When the transistor $Q_2$ becomes on-state, the transistor $Q_3$ becomes on-state also. Then, a current is supplied to the capacitor C through the diode D and the resistor $R_6$, raising the potential on the positive side of the capacitor C.

Further, when, for example, the output terminal of the pulse generating circuit 4 is at a low voltage as at the time $t=t_4$ in FIG. 3(*b*), and the lamp 3 is turned off, analogous to the case when the lamp 3 is not connected normally, the emitter potential of the transistor $Q_3$ is at a low voltage, so that the transistor $Q_3$ will be found in an off-state. Then, no current will be supplied to the capacitor C and a discharge current flows from the capacitor C through the resistors $R_7$ and $R_8$ so that the potential on the positive side will be decreased.

However, if the resistance of the resistor $R_7$ is set sufficiently large compared with the resistance of the resistor $R_6$, the decrease in the potential on the positive side of the capacitor C in the turned-off condition of the lamp 3 may be ignored in practice.

As in the foregoing, when the lamp 3 is short-circuited and the condition of excess current is brought about and an excess current flows in the transistor $Q_1$, the potential on the positive side of the capacitor C is increased stepwise as shown for the time $t>T_0$ in FIG. 3(*c*). At a time $t=T_1$ the potential reaches a threshold voltage $V\Delta i$ which is determined by the voltage division ratio due to the resistors $R_7$ and $R_8$, and the on-state voltage of the transistor $Q_4$. The transistor $Q_4$ is then brought to on-state and the transistor $Q_1$ is turned off. The potential on the positive side of the capacitor C continues to rise even thereafter due to the high level of the lighting pulse. And the potential is stabilized at a value which depends upon the lighting pulse, resistances of the resistors $R_7$ and $R_8$, the on-state value at the base of the transistor $Q_4$, the forward voltage of the diode D, and the collector-emitter saturation voltage of the transistor $Q_3$.

In order to put thereafter the transistor $Q_1$ again to a condition in which it is possible to drive the lamp, it is merely necessary to open the illumination switch 2 for a predetermined length of time, or output a signal from the pulse generating circuit 4 by keeping the voltage at low level for a predetermined length of time to turn off the transistor $Q_3$ and let the charges in the capacitor C discharge.

In the above embodiment, an NPN transistor is employed for driving the transistor $Q_1$. However, use may be made of a PNP transistor in which case the polarities of each of the transistors $Q_2$ to $Q_4$ must also be changed to the reversed conductivity types.

As described in the foregoing, according to the present invention, it is possible to protect the transistor for driving the lamp from excess load due to short-circuiting of the lamp or the like. Moreover, once the protective action is put into operation, the on-state of the driving transistor will not be reinstated unless the illumination switch is kept open for a predetermined length of time or the lighting pulse is maintained at a low level for a predetermined length of time. Therefore, the driving transistor will not suffer continuously from a stress due to short-circuiting failure.

Furthermore, there is provided a delay time from detection of an excess current to interruption action of the driving transistor, so that malfunctions due to a rush current in the lamp can also be prevented.

What is claimed is:

1. A dimming circuit for adjusting the radiation condition of a lamp by controlling the current flow in the lamp, comprising:

(a) a dimming transistor whose collector is connected to the lamp for controlling the current flow in the lamp;

(b) a pulse generating circuit means connected to the base of said dimming transistor for generating pulses to turn on or off said dimming transistor, said pulse generating circuit being able to control a duty-cycle of the pulses;

(c) means for protecting said dimming transistor against excessive current, said protecting means further comprising:

(i) an excess current detecting means connected to a collector or an emitter of said dimming transistor for detecting an excess current by sensing an excess voltage generated between the collector and the emitter when the excess current is supplied to said dimming transistor, (ii) a switching means connected to said excess current detecting means and said pulse generating circuit for outputting a pulsed excess current detecting signal when simultaneously receiving a signal from said excess current detecting means and the pulse signal from said pulse generating circuit, (iii) an off-state command signal generating circuit connected between an output terminal of said switching means and the base of said dimming transistor for outputting an off-state command signal to turn off said dimming transistor in accordance with the pulsed excess current detecting signal from said switching means.

2. The dimming circuit as claimed in claim 1, wherein the off-state command signal generating circuit comprises a time constant circuit for changing the pulsed excess current detecting signal from said switching means, and second switching means outputting the off-state command signal to said dimming transistor when the changed value of the time constant circuit reaches a predetermined value.

3. The dimming circuit as claimed in claim 2, wherein said first and second switching means comprise first and second transistors, respectively.

* * * * *